(12) United States Patent
Wu

(10) Patent No.: US 11,784,060 B2
(45) Date of Patent: Oct. 10, 2023

(54) METHOD FOR FORMING CONNECTING PAD AND SEMICONDUCTOR STRUCTURE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 32 days.

(21) Appl. No.: 17/510,391

(22) Filed: Oct. 26, 2021

(65) Prior Publication Data

US 2023/0005757 A1 Jan. 5, 2023

Related U.S. Application Data

(63) Continuation of application No. PCT/CN2021/117460, filed on Sep. 9, 2021.

(30) Foreign Application Priority Data

Jul. 5, 2021 (CN) .......................... 202110758234.2

(51) Int. Cl.
*H01L 21/3213* (2006.01)
*H01L 49/02* (2006.01)

(52) U.S. Cl.
CPC ........ *H01L 21/32139* (2013.01); *H01L 28/40* (2013.01)

(58) Field of Classification Search
CPC ................................................. H01L 21/32139
See application file for complete search history.

(56) References Cited

U.S. PATENT DOCUMENTS

2017/0005174 A1* 1/2017 Sakurai ............. H01L 29/66575

FOREIGN PATENT DOCUMENTS

| CN | 108519725 A | 9/2018 |
|---|---|---|
| CN | 109116674 A | 1/2019 |
| CN | 111381434 A | 7/2020 |

OTHER PUBLICATIONS

European Patent Office, Extended European Search Report Issued in Application No. 21881347.5, dated Jan. 19, 2023, Germany, 6 pages.

* cited by examiner

*Primary Examiner* — Walter H Swanson
(74) *Attorney, Agent, or Firm* — KILPATRICK TOWNSEND & STOCKTON LLP

(57) ABSTRACT

Embodiments provide method for forming a connecting pad. The method includes: providing a substrate; sequentially forming a conductive layer, a first pattern definition layer and a second pattern definition layer on a surface of the substrate; sequentially forming three groups of patterns intersecting with each other at 120° on the second pattern definition layer, an intersection portion of the three groups of patterns forming a hexagonal pattern definition structure on the second pattern definition layer; transferring the pattern definition structure downward, and etching away a portion of the first pattern definition layer, such that the remaining first pattern definition layer forms a columnar structure, wherein a bottom of the columnar structure is circular in shape under an action of an etching load effect; and etching the conductive layer by using the remaining first pattern definition layer as a mask, such that the remaining conductive layer forms a circular connecting pad.

16 Claims, 14 Drawing Sheets

METHOD FOR FORMING CONNECTING PAD AND SEMICONDUCTOR STRUCTURE

CROSS-REFERENCE TO RELATED APPLICATION

The present disclosure is a continuation of PCT/CN2021/117460, filed on Sep. 9, 2021, which claims priority to Chinese Patent Application No. 202110758234.2 titled "METHOD FOR FORMING CONNECTING PAD AND SEMICONDUCTOR STRUCTURE" and filed on Jul. 5, 2021, the entire contents of which are incorporated herein by reference.

TECHNICAL FIELD

The present disclosure relates to the technical field of methods for fabricating semiconductor memory devices, and more particularly, to a method for forming a connecting pad and a semiconductor structure.

BACKGROUND

In solutions for manufacturing capacitors of the existing semiconductor structures, due to exposure limits, typically two layers of photomasks are used in the current immersion photolithography process to form linear patterns in two directions. The linear patterns in the two directions enclose a blank parallelogram pattern. After dry etching, the pattern is transferred downward, and finally an array of connecting pads in a substantially hexagonal arrangement mode is formed.

However, taking a single connecting pad as an example, during the pattern transfer process, a hole corresponding to the connecting pad changes from an original parallelogram to an ellipse and is transferred downward. Due to an etching load effect, a top of the hole is constantly subjected to plasma effect and shaped like a relatively regular circle. A near-bottom of the hole is primarily subjected to bombardment of an etching gas, causing the bottom of the hole to maintain its original elliptical shape, so the connecting pad is shaped like an oval. Dimensions of the elliptical connecting pad are not uniform in a long axis direction and a short axis direction, resulting in insufficient margin in the short axis direction during a capacitor patterning process, and it cannot be stopped on the connecting pad during etching, which may cause breakdown, thus leading to problems such as capacitor leakage.

SUMMARY

One aspect of embodiments of the present disclosure provides a method for forming a connecting pad, wherein the method includes: providing a substrate; sequentially forming a conductive layer, a first pattern definition layer and a second pattern definition layer on a surface of the substrate; sequentially forming a first group of patterns, a second group of patterns, and a third group of patterns intersecting with each other at 120° on the second pattern definition layer, an intersection portion of the three groups of patterns forming a hexagonal pattern definition structure on the second pattern definition layer; transferring the pattern definition structure downward, and etching away a portion of the first pattern definition layer, such that the remaining first pattern definition layer forms a columnar structure, wherein a bottom of the columnar structure is circular in shape under an action of an etching load effect; and etching the conductive layer by using the remaining first pattern definition layer as a mask, such that the remaining conductive layer forms a circular connecting pad.

Another aspect of the embodiments of the present disclosure provides a semiconductor structure having a connecting pad, wherein the connecting pad is formed by means of the method for forming a connecting pad proposed in the present disclosure and described in the above-mentioned embodiments.

DETAILED DESCRIPTION

Figure 1:
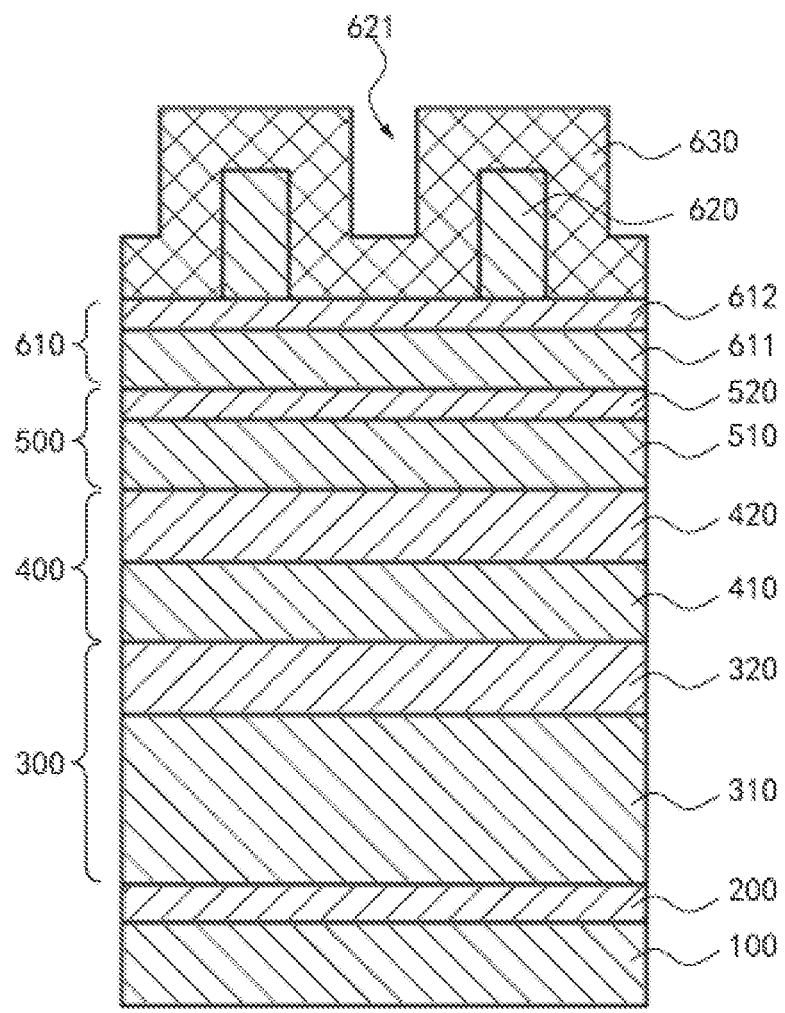
FIGS. 1 to 3, FIGS. 5 to 8, FIGS. 10 to 13, FIGS. 15 to 17, FIG. 19 and FIG. 20 respectively are schematic structural diagrams of a semiconductor structure formed in some steps of a method for forming a connecting pad according to the present disclosure.

Exemplary embodiments will now be described more fully with reference to the accompanying drawings. However, the exemplary embodiments can be implemented in a variety of forms and should not be construed as limited to the embodiments set forth herein. Rather, these embodiments are provided such that the present disclosure will be thorough and complete and will fully convey the concepts of exemplary embodiments to those skilled in the art. Throughout the drawings, similar reference signs indicate the same or similar structures, and thus their detailed descriptions are omitted.

Referring to FIG. 1 to FIG. 3, FIG. 5 to FIG. 8, FIG. 10 to FIG. 13, FIG. 15 and FIG. 17, schematic structural diagrams of a semiconductor structure formed in some steps of a method for forming a connecting pad proposed in the present disclosure are typically illustrated, respectively. In this exemplary embodiment, this method for forming a connecting pad proposed in the present disclosure is described by means of an example where an immersion lithography process is employed to form a capacitor of a semiconductor structure. It is readily comprehensible to those skilled in the art that to apply relevant design of the present disclosure to other types of capacitor structures or other processes, various modifications, additions, substitutions, deletions or other variations are made to the following embodiments, and these variations are still within the scope of the principle of the method for forming a connecting pad proposed in the present disclosure.

As shown in FIG. 1 to FIG. 3, FIG. 5 to FIG. 8, FIG. 10 to FIG. 13, FIG. 15 to FIG. 17, FIG. 19 and FIG. 20, in this embodiment, the method for forming a connecting pad proposed in the present disclosure includes following steps:

providing a substrate 100;

sequentially forming a conductive layer 200, a first pattern definition layer 300 and a second pattern definition layer 500 on a surface of the substrate 100;

sequentially forming three groups of trenches G1, G2 and G3 intersecting with each other at 120° on the second pattern definition layer 500, an intersection portion of the three groups of trenches forming a hexagonal first hole h1 on the second pattern definition layer 500;

transferring the first hole h1 downward, and etching away a portion of the first pattern definition layer 300 based on a reverse selection mode, such that the remaining first pattern definition layer 300 forms a second columnar structure 330 corresponding to the first hole h1, wherein a bottom of the second columnar structure 330 is circular in shape under an action of an etching load effect; and etching the conductive layer 200 by using the remaining first pattern definition layer 300 as a mask, such that the remaining conductive layer 200 forms a circular connecting pad 210.

From the above description, according to the method for forming a connecting pad proposed in the present disclosure, a hexagonal first hole h1 is formed by means of a triple exposure process. In the process of transferring the first hole h1 downward, under the action of the etching load effect, the columnar structure defining the connection pad 210 is transformed from a hexagonal straight edge profile at the top to a more regular circle, such that the shape of the connection pad 210 is significantly improved. By means of the above design, the present disclosure can ensure that the connecting pad 210 is circular, such that the connecting pad 210 has a larger margin during a capacitor patterning process, and it can be stopped on the connecting pad 210 during etching, thus avoiding a problem of capacitor leakage caused by breakdown.

In some embodiments, as shown in FIG. 1 to FIG. 3, FIG. 5 to FIG. 8, FIG. 10 to FIG. 13, FIG. 15 to FIG. 17, FIG. 19 and FIG. 20, in this embodiment, the step of forming a first pattern definition layer 300 on a surface of the conductive layer 200 may include:

forming a first passivation layer 310 on the surface of the conductive layer 200; and forming a first sacrificial layer 320 on a surface of the first passivation layer 310, wherein the first sacrificial layer 320 and the first passivation layer 310 together form the first pattern definition layer 300.

In some embodiments, as shown in FIG. 1 to FIG. 3, FIG. 5 to FIG. 8, FIG. 10 to FIG. 13, FIG. 15 to FIG. 17, FIG. 19 and FIG. 20, in this embodiment, a pattern transfer layer 400 may also be formed between the first pattern definition layer 300 and the second pattern definition layers 500. In this way, reverse selective etching during the downward transfer of the first hole h1 of the second pattern definition layer 500 is implemented. In some embodiments, the formation of the pattern transfer layer 400 may include the following steps:

forming a polysilicon contact layer 410 (Poly-Si) on a surface of the first pattern definition layer 300 (that is, a surface of the first sacrificial layer 320); and forming a second sacrificial layer on a surface of the polysilicon contact layer 410.

Based on the above-mentioned process design for forming the pattern transfer layer 400, the processes in the step of pattern reverse selective etching will be described in the following content in the order of the processes and the drawings. It should be noted that in other embodiments, to allow the first hole h1 of the second pattern definition layer 500 to transfer to the first pattern definition layer 300 by means of reverse selective etching to form the second columnar structure 330, it is also advisable that the pattern transfer layer in this embodiment is not provided. That is, the formation of the second columnar structure 330 may be implemented by other processes and is not limited to this embodiment.

In some embodiments, as shown in FIG. 1 to FIG. 3, FIG. 5 to FIG. 8, FIG. 10 to FIG. 13, FIG. 15 to FIG. 17, FIG. 19 and FIG. 20, in this embodiment, the step of forming a second pattern definition layer 500 on a surface of the pattern transfer layer 400 may include:

forming a second passivation layer 510 on the surface of the pattern transfer layer 400; and forming a first anti-reflection layer 520 on a surface of the second passivation layer 510, wherein the first anti-reflection layer 520 and the second passivation layer 510 together form the second pattern definition layer 500, and the three groups of trenches G1, G2 and G3 are formed on the first anti-reflection layer 520.

Figure 2:
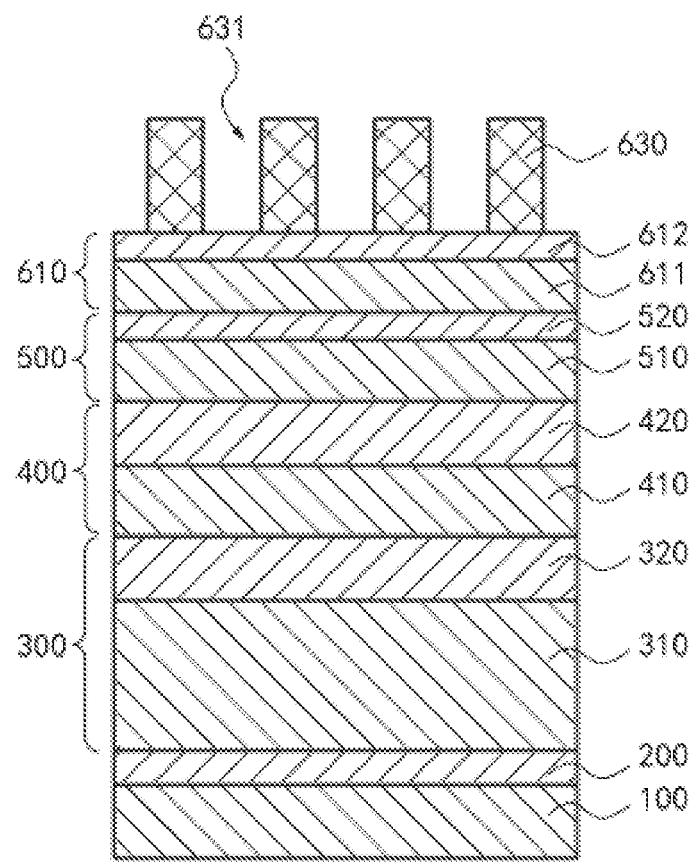
Figure 3:
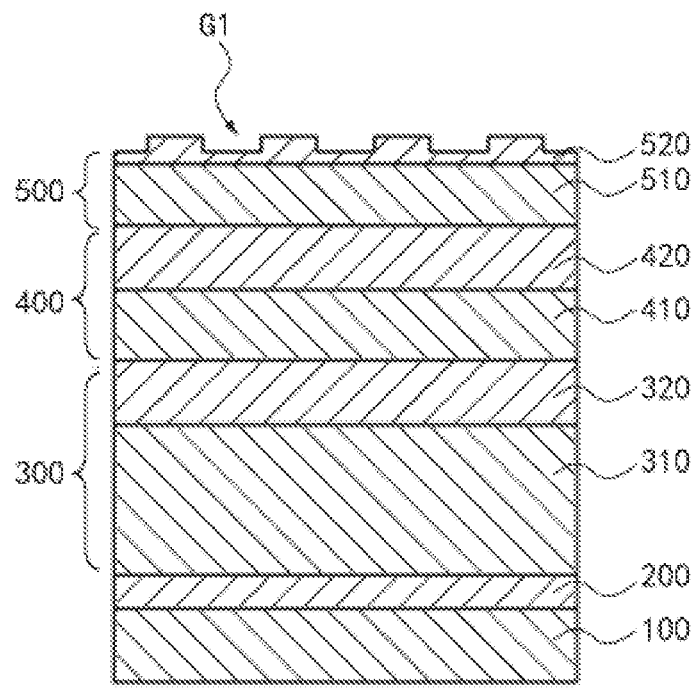

In some embodiments, as shown in FIGS. 1 to 3, the step of forming a first group of trenches G1 on the second pattern definition layer 500 may include:

forming a first mask layer 610 on the surface of the second pattern definition layer 500;

forming a first trench structure 631 on a surface of the first mask layer 610 by means of a pitch multiplication process; and etching the second pattern definition layer 500 by using the first mask layer 610 as a mask, such that the first trench structure 631 is transferred to the second pattern definition layer 500 to form the first group of trenches G1.

Further, as shown in FIGS. 1 to 3, based on the above-mentioned process design for forming the first group of trenches G1, in this embodiment, the step of forming a first mask layer 610 on the surface of the second pattern definition layer 500 may include:

forming a third passivation layer 611 on the surface of the second pattern definition layer 500; and forming a second anti-reflection layer 612 on a surface of the third passivation layer 611, wherein the second anti-reflection layer 612 and the third passivation layer 611 together form the first mask layer 610.

Further, as shown in FIGS. 1 to 3, based on the above-mentioned process design for forming the first group of trenches G1, in this embodiment, the step of forming a first trench structure 631 on a surface of the first mask layer 610 by means of a pitch multiplication process may include:

forming a first photoresist layer 620 on the surface of the first mask layer 610;

patterning the first photoresist layer 620 to form a first opening 621;

forming a third sacrificial layer 630 on the surface of the first mask layer 610 and a surface of the first photoresist layer 620, wherein the third sacrificial layer 630 covers a sidewall and a bottom wall of the first opening 621; and etching away the third sacrificial layer 630 positioned on the surface of the first mask layer 610 and on a top of the first photoresist layer 620, wherein the remaining third sacrificial layer 630 is the first trench structure 631.

In some embodiments, as shown in FIG. 1, a schematic structural diagram of the semiconductor structure in the step of forming a third sacrificial layer 630 on the surface of the first mask layer 610 and a surface of the first photoresist layer 620 is typically illustrated. In some embodiments, in this step, the semiconductor structure includes the substrate 100, the conductive layer 200, the first pattern definition layer 300, the pattern transfer layer 400, the second pattern definition layer 500, the first mask layer 610, the patterned first photoresist layer 620, and the third sacrificial layer 630. The conductive layer 200 is formed on the surface of the substrate 100. The first pattern definition layer 300 is formed on the surface of the conductive layer 200, wherein the first pattern definition layer 300 sequentially includes the first passivation layer 310 and the first sacrificial layer 320. The pattern transfer layer 400 is formed on the surface of the first sacrificial layer 320, wherein the pattern transfer layer 400 includes the polysilicon contact layer 410 and the second sacrificial layer 420 in sequence. The second pattern definition layer 500 is formed on the surface of the second sacrificial layer 420, and includes the second passivation layer 510 and the first anti-reflection layer 520. The first mask layer 610 is formed on the surface of the second pattern definition layer 500, and includes the third passivation layer 611 and the second anti-reflection layer 612. The first photoresist layer 620 is formed on the surface of the first mask layer 610, and the first photoresist layer 620 is patterned to form the first opening 621. The third sacrificial layer 630 is formed on the surface of the first mask layer 610 and the surface of the remaining first photoresist layer 620. That is, the third sacrificial layer 630 covers the surface of the first mask layer 610 exposed to the first opening 621, and covers the sidewall and the bottom wall of the first opening 621.

Further, in this embodiment, a material of the conductive layer 200 may include, but is not limited to, tungsten (W).

Further, in this embodiment, the first passivation layer 310 may include, but is not limited to, a diamond-like carbon (DLC) coating.

Further, in this embodiment, a material of the first sacrificial layer 320 may include, but is not limited to, silicon nitride (Si3N4).

Further, in this embodiment, a material of the second sacrificial layer 420 may include, but is not limited to, silicon dioxide (SiO2).

Further, in this embodiment, the second passivation layer 510 may include, but is not limited to, the DLC coating.

Further, in this embodiment, a material of the first anti-reflection layer 520 may include, but is not limited to, silicon oxynitride (SiON).

Further, in this embodiment, the third passivation layer 611 may include, but is not limited to, the DLC coating.

Further, in this embodiment, a material of the third sacrificial layer 630 may include, but is not limited to, silicon dioxide.

Further, in this embodiment, a material of the second anti-reflection layer 612 may include, but is not limited to, silicon oxynitride.

As shown in FIG. 2, a schematic structural diagram of the semiconductor structure in the step of forming a first trench structure 631 on a surface of the first mask layer 610 is typically illustrated. In some embodiments, in this step, the semiconductor structure includes the substrate 100, the conductive layer 200, the first pattern definition layer 300, the pattern transfer layer 400, the second pattern definition layer 500, the first mask layer 610, and the remaining third sacrificial layer 630. By means of the pitch multiplication process, the portion of the third sacrificial layer 630 positioned on the surface of the first mask layer 610 and on the top surface of the first photoresist layer 620 is etched away, and the remaining third sacrificial layer 630 forms the first trench structure 631. Moreover, in the above-mentioned etching process, the remaining first photoresist layer 620 is completely removed.

Figure 4:
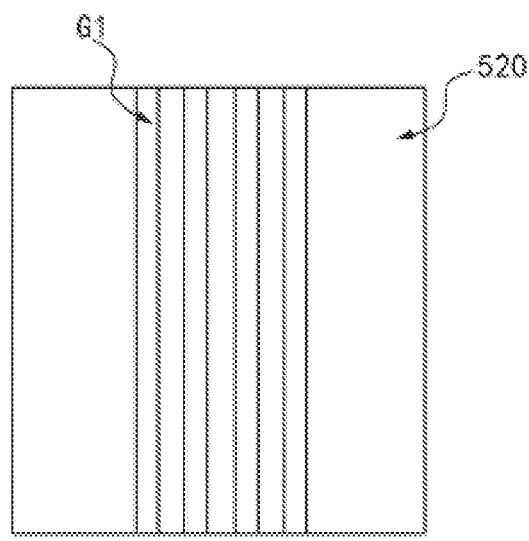
FIG. 4, FIG. 9, FIG. 14, FIG. 18, and FIG. 21 respectively are plan views of the semiconductor structure in some steps of the method for forming a connecting pad according to the present disclosure.

As shown in FIG. 3, a schematic structural diagram of the semiconductor structure in the step of transferring the first trench structure 631 to the second pattern definition layer 500 to form the first group of trenches G1 is typically illustrated. As shown in FIG. 4, a plan view of the semiconductor structure in the step of transferring the first trench structure 631 to the second pattern definition layer 500 to form the first group of trenches G1 is typically illustrated. In some embodiments, in this step, the semiconductor structure includes the substrate 100, the conductive layer 200, the first pattern definition layer 300, the pattern transfer layer 400, and the second pattern definition layer 500 formed with the first group of trenches G1. In this step, the first trench structure 631 may be transferred to the first anti-reflection layer 520 of the second pattern definition layer 500 by means of a dry etching process, such that the first group of trenches G1 are formed on the surface of the first anti-reflection layer 520. In addition, in the above-mentioned etching process, both the first trench structure 631 (that is, the remaining third sacrificial layer 630) and the first mask layer 610 are completely removed.

In some embodiments, as shown in FIG. 5 to FIG. 8, the step of forming a second group of trenches G2 on the second pattern definition layer 500 may include:

forming a second mask layer 710 on the surface of the second pattern definition layer 500, wherein the second mask layer 710 fills in the first group of trenches G1;

forming a second trench structure 731 on the surface of the second mask layer 710 by means of the pitch multiplication process; and etching the second pattern definition layer 500 by using the second mask layer 710 as a mask, such that the second trench structure 731 is transferred to the second pattern definition layer 500 to form the second group of trenches G2.

Further, as shown in FIGS. 5 to 8, based on the above-mentioned process design for forming the second group of trenches G2, in this embodiment, the step of forming a second mask layer 710 on the surface of the second pattern definition layer 500 may include:

forming a fourth passivation layer 711 on the surface of the second pattern definition layer 500; and forming a third anti-reflection layer 712 on a surface of the fourth passivation layer 711, wherein the third anti-reflection layer 712 and the fourth passivation layer 711 together form the second mask layer 710.

Further, as shown in FIGS. 5 to 8, based on the above-mentioned process design for forming the second group of trenches G2, in this embodiment, the step of forming a second trench structure 731 on the surface of the second mask layer 710 by means of the pitch multiplication process may include:

forming a second photoresist layer 720 on the surface of the second mask layer 710;

patterning the second photoresist layer 720 to form a second opening 721;

forming a fourth sacrificial layer 730 on the surface of the second mask layer 710 and a surface of the second photoresist layer 720, wherein the fourth sacrificial layer 730 covers a sidewall and a bottom wall of the second opening 721; and etching away the fourth sacrificial layer 730 positioned on the surface of the second mask layer 710 and on a top of the second photoresist layer 720, wherein the remaining fourth sacrificial layer 730 is the second trench structure 731.

Figure 5:
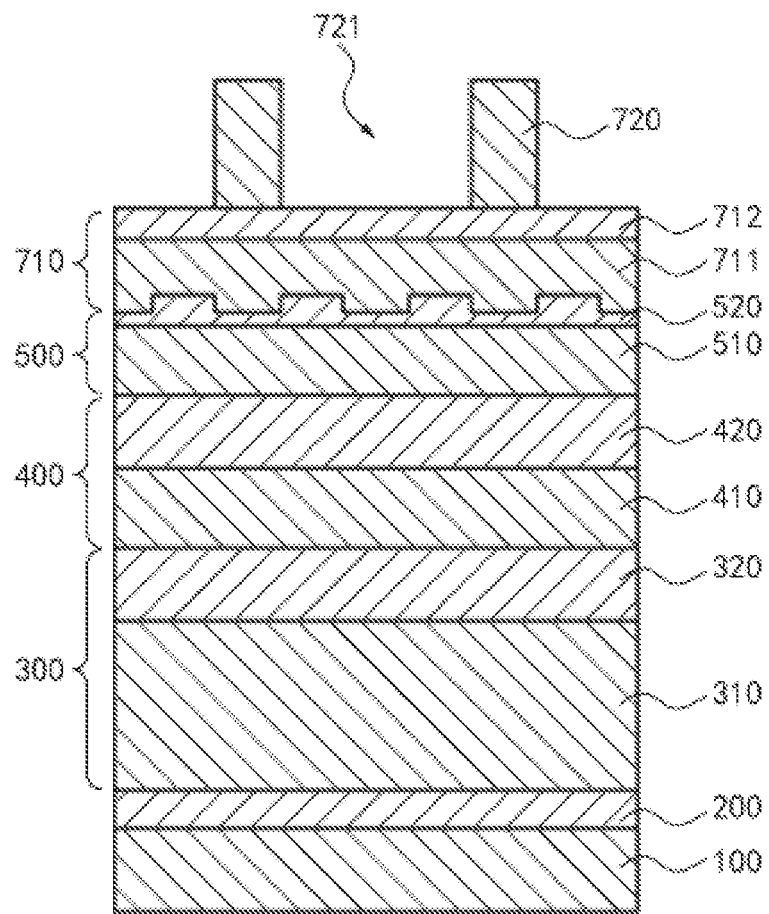

In some embodiments, as shown in FIG. 5, a schematic structural diagram of the semiconductor structure in the step of forming a second photoresist layer 720 on the second mask layer 710 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1, the second mask layer 710, and the patterned second photoresist layer 720. The second mask layer 710 is formed on the surface of the second pattern definition layer 500, and the second mask layer 710 is filled in the first group of trenches G1 on the surface of the first anti-reflection layer 520, wherein the second mask layer 710 includes the fourth passivation layer 711 and the third anti-reflection layer 712. The second photoresist layer 720 is formed on the surface of the second mask layer 710, and the second photoresist layer 720 is patterned to form the second opening 721.

Further, in this embodiment, the fourth passivation layer 711 may be formed on the second pattern definition layer 500 by means of a spin coating process.

Further, in this embodiment, a material of the third anti-reflection layer 712 may include, but is not limited to, silicon oxynitride.

Figure 6:
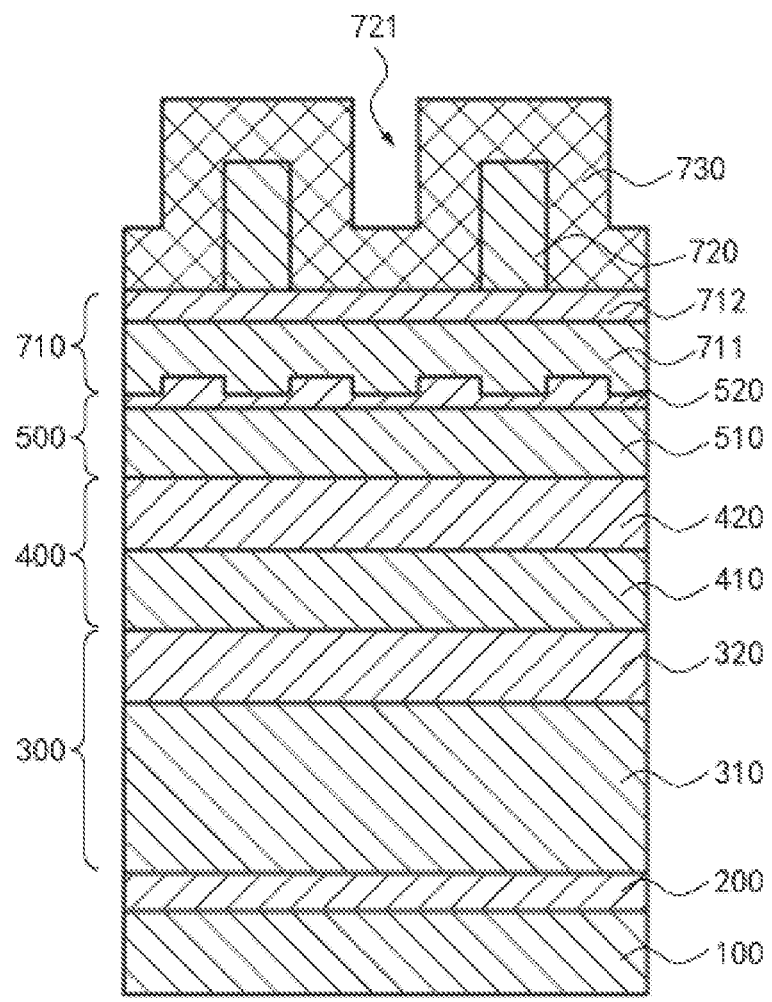

As shown in FIG. 6, a schematic structural diagram of the semiconductor structure in the step of forming a fourth sacrificial layer 730 on the surface of the second mask layer 710 and a surface of the second photoresist layer 720 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1, the second mask layer 710, the patterned second photoresist layer 720, and the fourth sacrificial layer 730. The fourth sacrificial layer 730 is formed on the surface of the second mask layer 710 and the surface of the remaining second photoresist layer 720. That is, the fourth sacrificial layer 730 covers the surface of the second mask layer 710 exposed to the second opening 721, and covers the sidewall and the bottom wall of the second opening 721.

Further, in this embodiment, a material of the fourth sacrificial layer 730 may include, but is not limited to, silicon dioxide.

Figure 7:
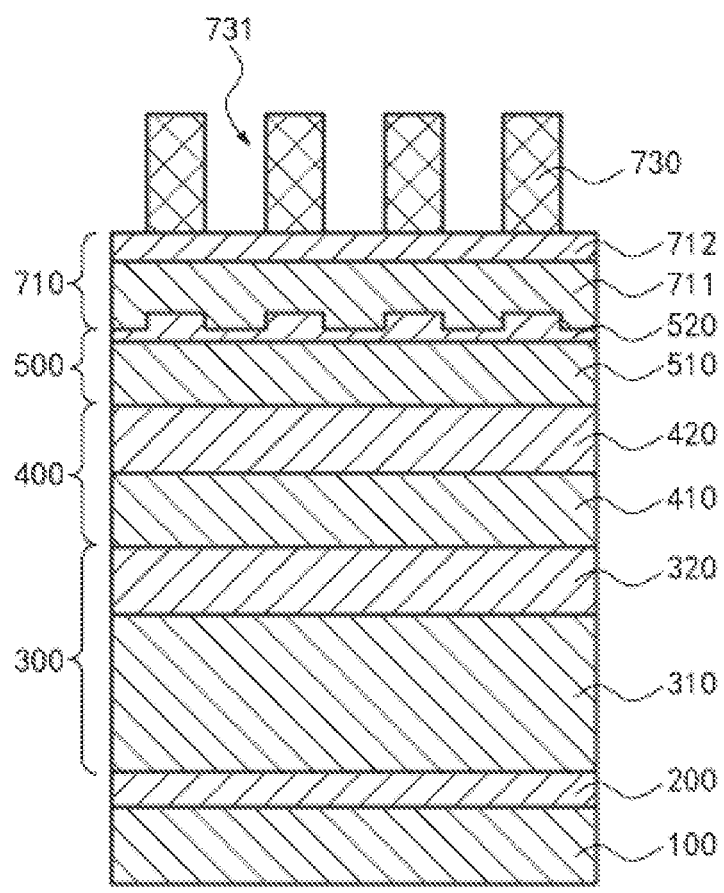

As shown in FIG. 7, a schematic structural diagram of the semiconductor structure in the step of forming a second trench structure 731 on a surface of the second mask layer 710 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1, the second mask layer 710, and the remaining fourth sacrificial layer 730. By means of the pitch multiplication process, the portion of the fourth sacrificial layer 730 positioned on the surface of the second mask layer 710 and on the top surface of the second photoresist layer 720 is etched away, and the remaining fourth sacrificial layer 730 forms the second trench structure 731. Moreover, in the above-mentioned etching process, the remaining second photoresist layer 720 is completely removed.

Figure 8:
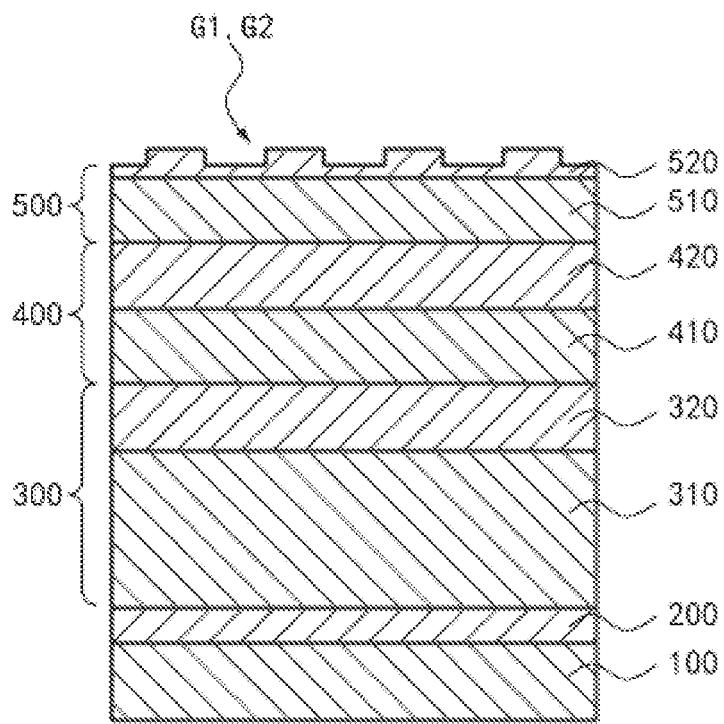
Figure 9:
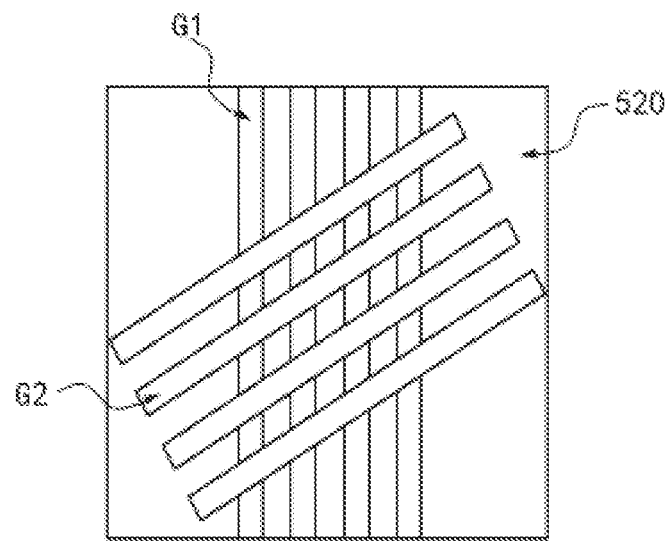

As shown in FIG. 8, a schematic structural diagram of the semiconductor structure in the step of transferring the second trench structure 731 to the second pattern definition layer 500 to form the second group of trenches G2 is typically illustrated. As shown in FIG. 9, a plan view of the semiconductor structure in the step of transferring the second trench structure 731 to the second pattern definition layer 500 to form the second group of trenches G2 is typically illustrated. In some embodiments, in this step, the semiconductor structure includes the substrate 100, the conductive layer 200, the first pattern definition layer 300, the pattern transfer layer 400, and the second pattern definition layer 500 formed with the first group of trenches G1 and the second group of trenches G2. In this step, the second trench structure 731 may be transferred to the first anti-reflection layer 520 of the second pattern definition layer 500 by means of a dry etching process, such that the second group of trenches G2 are formed on the surface of the first anti-reflection layer 520 having formed with the first group of trenches G1. In addition, in the above-mentioned etching process, both the second trench structure 731 (that is, the remaining fourth sacrificial layer 730) and the second mask layer 710 are completely removed. In the plan view of the semiconductor structure as shown in FIG. 9, an angle of 120° is formed between the first group of trenches G1 and the second group of trenches G2.

In some embodiments, as shown in FIG. 10 to FIG. 13, the step of forming a third group of trenches G3 on the second pattern definition layer 500 may include:

forming a third mask layer 810 on the surface of the second pattern definition layer 500, wherein the third mask layer 810 fills in the first group of trenches G1 and the second group of trenches G2;

forming a third trench structure 831 on the surface of the third mask layer 810 by means of the pitch multiplication process; and etching the second pattern definition layer 500 by using the third mask layer 810 as a mask, such that the third trench structure 831 is transferred to the second pattern definition layer 500 to form the third group of trenches G3.

Further, as shown in FIGS. 10 to 13, based on the above-mentioned process design for forming the third group of trenches G3, in this embodiment, the step of forming a third mask layer 810 on the surface of the second pattern definition layer 500 may include:

forming a fifth passivation layer 811 on the surface of the second pattern definition layer 500; and forming a fourth anti-reflection layer 812 on a surface of the fifth passivation layer 811, wherein the fourth anti-reflection layer 812 and the fifth passivation layer 811 together form the third mask layer 810.

Further, as shown in FIGS. 10 to 13, based on the above-mentioned process design for forming the third group of trenches G3, in this embodiment, the step of forming a third trench structure 831 on a surface of the third mask layer 810 by means of the pitch multiplication process may include:

forming a third photoresist layer 820 on the surface of the third mask layer 810;

patterning the third photoresist layer 820 to form a third opening 821;

forming a fifth sacrificial layer 830 on the surface of the third mask layer 810 and a surface of the third photoresist layer 820, wherein the fifth sacrificial layer 830 covers a sidewall and a bottom wall of the third opening 821; and etching away the fifth sacrificial layer 830 positioned on the surface of the third mask layer 810 and on a top of the third photoresist layer 820, wherein the remaining fifth sacrificial layer 830 is the third trench structure 831.

Figure 10:
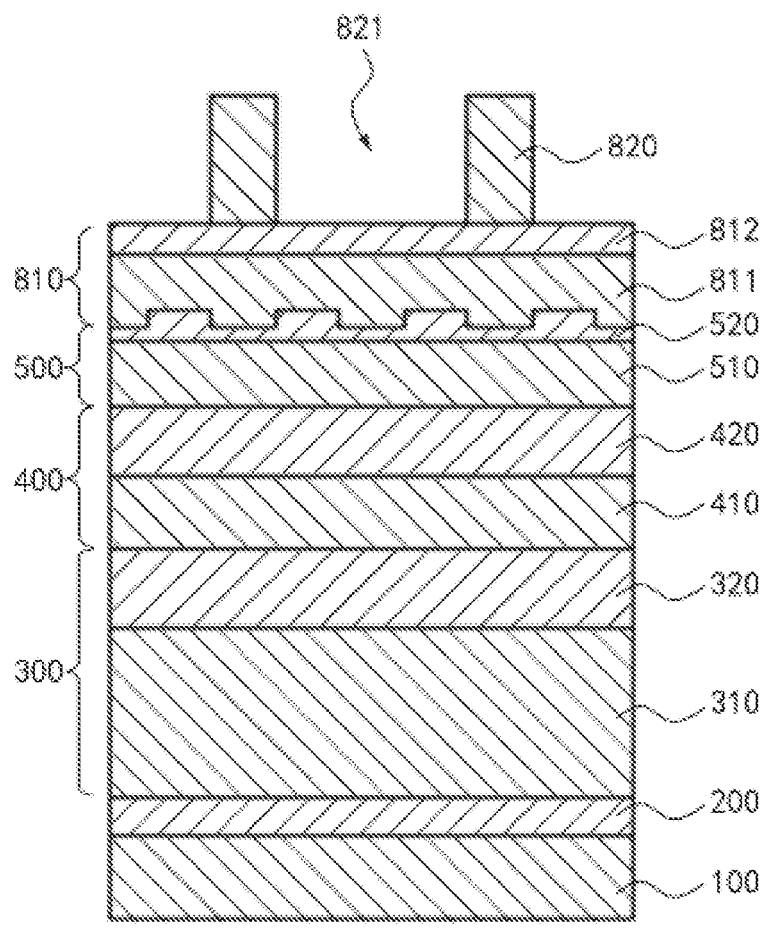

In some embodiments, as shown in FIG. 10, a schematic structural diagram of the semiconductor structure in the step of forming a third photoresist layer 820 on the third mask layer 810 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1 and the second group of trenches G2, the third mask layer 810, and the patterned third photoresist layer 820. The third mask layer 810 is formed on the surface of the second pattern definition layer 500, and the third mask layer 810 is filled in the first group of trenches G1 and the second group of trenches G2 on the surface of the first anti-reflection layer 520, wherein the third mask layer 810 includes the fifth passivation layer 811 and the fourth anti-reflection layer 812. The third photoresist layer 820 is formed on the surface of the third mask layer 810, and the third photoresist layer 820 is patterned to form the third opening 821.

Further, in this embodiment, the fifth passivation layer 811 may be formed on the second pattern definition layer 500 by means of a spin coating process.

Further, in this embodiment, a material of the fourth anti-reflection layer 812 may include, but is not limited to, silicon oxynitride.

Figure 11:
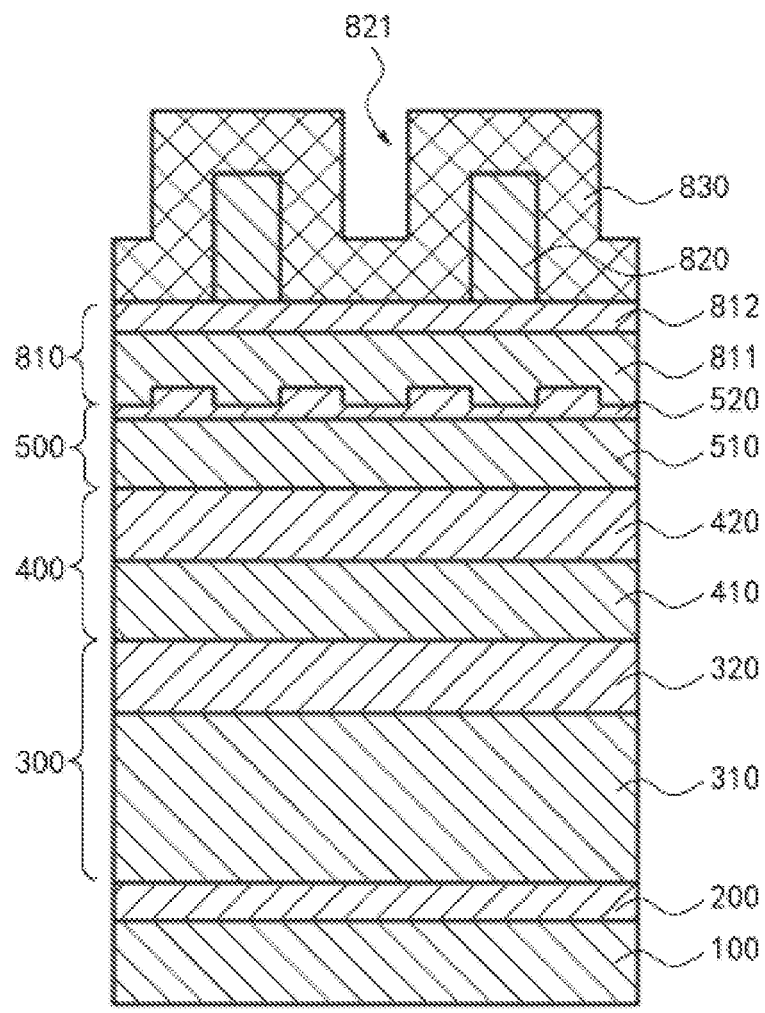

As shown in FIG. 11, a schematic structural diagram of the semiconductor structure in the step of forming a fifth sacrificial layer 830 on the surface of the third mask layer 810 and a surface of the third photoresist layer 820 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1 and the second group of trenches G2, the third mask layer 810, the patterned third photoresist layer 820, and the fifth sacrificial layer 830. The fifth sacrificial layer 830 is formed on the surface of the third mask layer 810 and the surface of the remaining third photoresist layer 820. That is, the fifth sacrificial layer 830 covers the surface of the third mask layer 810 exposed to the third opening 821, and covers the sidewall and the bottom wall of the third opening 821.

Further, in this embodiment, a material of the fifth sacrificial layer 830 may include, but is not limited to, silicon dioxide.

Figure 12:
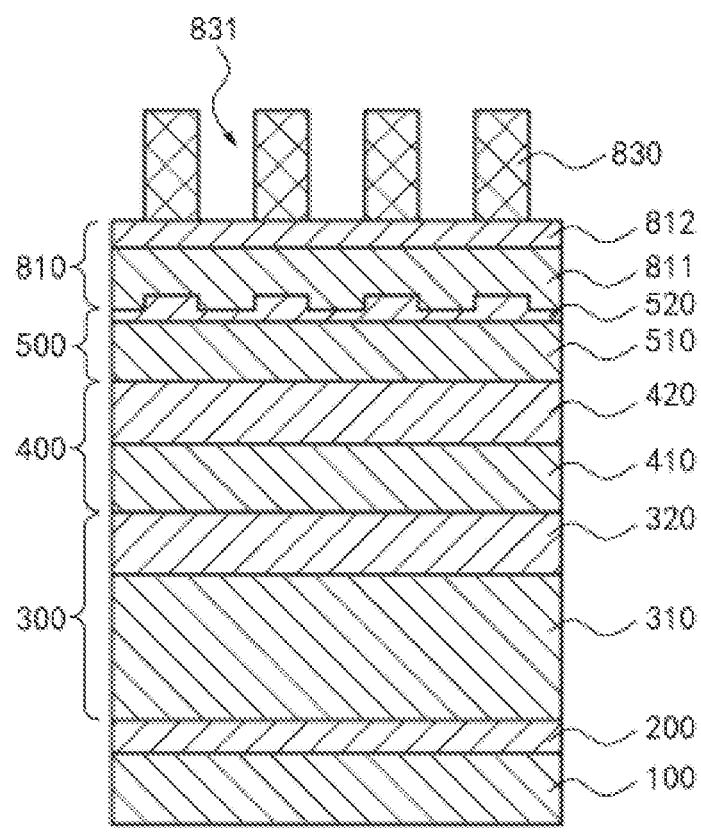

As shown in FIG. 12, a schematic structural diagram of the semiconductor structure in the step of forming a third trench structure 831 on a surface of the third mask layer 810 is typically illustrated. In some embodiments, in this step, the semiconductor structure includes the substrate 100, the conductive layer 200, the first pattern definition layer 300, the pattern transfer layer 400, the second pattern definition layer 500 formed with the first group of trenches G1 and the second group of trenches G2, the third mask layer 810, and the remaining fifth sacrificial layer 830. By means of the pitch multiplication process, the portion of the fifth sacrificial layer 830 positioned on the surface of the third mask layer 810 and on the top surface of the third photoresist layer 820 is etched away, and the remaining fifth sacrificial layer 830 forms the third trench structure 831. Moreover, in the above-mentioned etching process, the remaining third photoresist layer 820 is completely removed.

Figure 13:
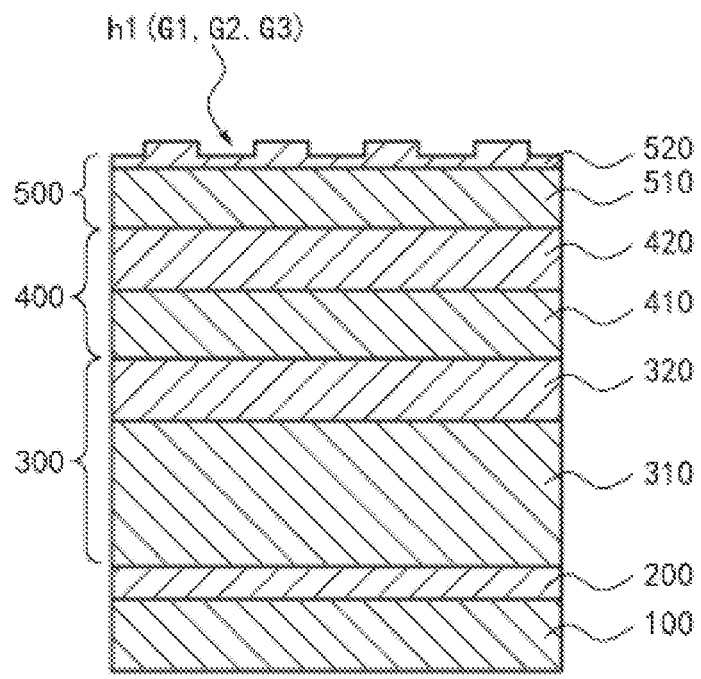
Figure 14:
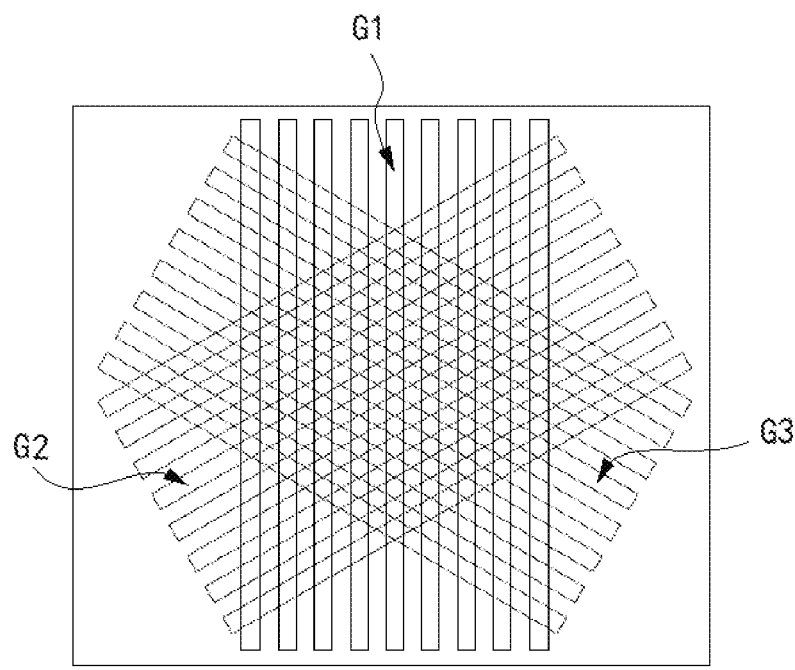

As shown in FIG. 13, a schematic structural diagram of the semiconductor structure in the step of transferring the third trench structure 831 to the second pattern definition layer 500 to form the third group of trenches G3 is typically illustrated. As shown in FIG. 14, a plan view of the semiconductor structure in the step of transferring the third trench structure 831 to the second pattern definition layer 500 to form the third group of trenches G3 is typically illustrated. In some embodiments, in this step, the semiconductor structure includes the substrate 100, the conductive layer 200, the first pattern definition layer 300, the pattern transfer layer 400, and the second pattern definition layer 500 formed with the first group of trenches G1, the second group of trenches G2, and the third group of trenches G3. In this step, the third trench structure 831 may be transferred to the first anti-reflection layer 520 of the second pattern definition layer 500 by means of a dry etching process, such that the third group of trenches G3 are formed on the surface of the first anti-reflection layer 520 having formed with the first group of trenches G1 and the second group of trenches G2. In addition, in the above-mentioned etching process, both the third trench structure 831 (that is, the remaining fifth sacrificial layer 830) and the third mask layer 810 are completely removed. In the plan view of the semiconductor structure as shown in FIG. 14, an angle of 120° is formed between the first group of trenches G1 and the third group of trenches G3, and an angle of 120° is formed between the second group of trenches G2 and the third group of trenches G3. That is, an angle of 120° is formed between the three groups of trenches G1, G2, and G3.

Figure 15:
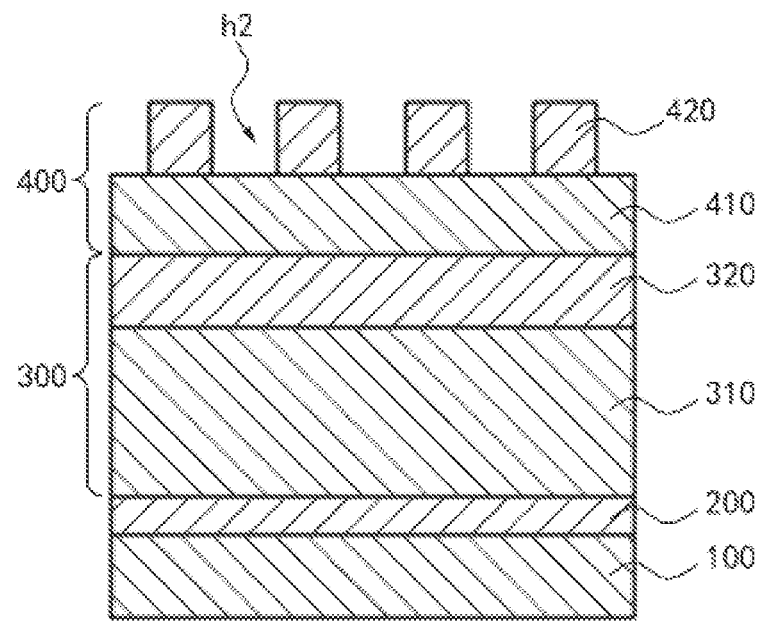
Figure 16:
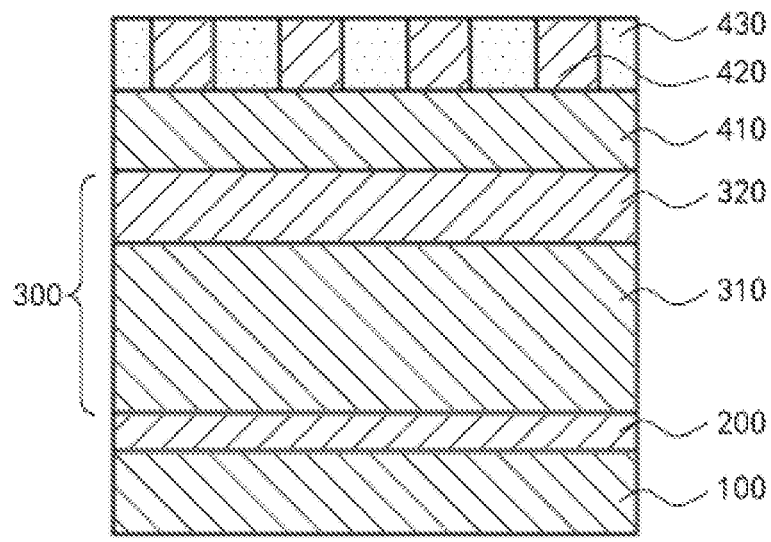
Figure 17:
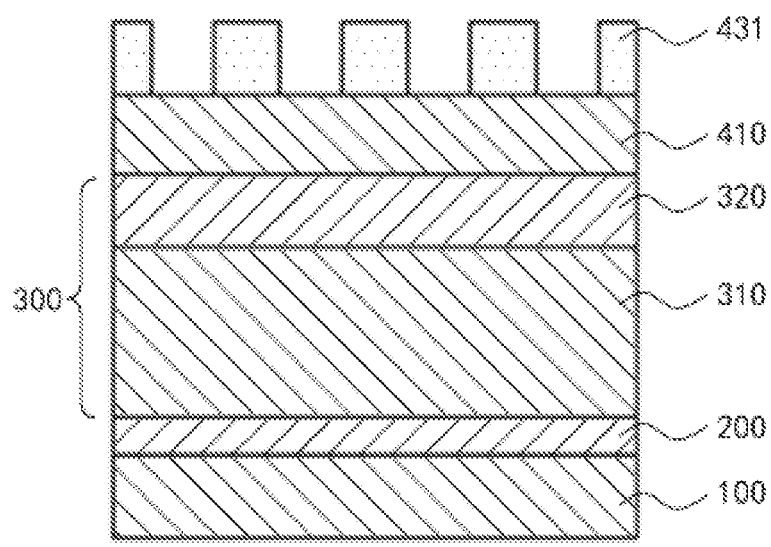

In some embodiments, as shown in FIG. 15 to FIG. 17, in this embodiment, the step of transferring the first hole h1 downward, and etching away a portion of the first pattern definition layer 300 based on a reverse selection mode may include:

etching the pattern transfer layer 400 by using the second pattern definition layer 500 as a mask, such that the first hole h1 is transferred to the pattern transfer layer 400 to form a hexagonal second hole h2;

forming a sixth passivation layer 430 on a surface of the pattern transfer layer 400, wherein the sixth passivation layer 430 fills in the second hole h2 and is flush with the surface of the pattern transfer layer 400;

removing the remaining pattern transfer layer 400, such that the sixth passivation layer 430 forms a hexagonal columnar structure (that is, a first columnar structure 431) positioned on the surface of the first pattern definition layer 300;

etching the first pattern definition layer 300 by using the sixth passivation layer 430 as a mask, such that the remaining first pattern definition layer 300 forms a columnar structure (that is, a second columnar structure 330).

In some embodiments, as shown in FIG. 15, a schematic structural diagram of the semiconductor structure in the step of etching the pattern transfer layer 400 by using the second pattern definition layer 500 as a mask is typically illustrated. In some embodiments, in this step, the semiconductor structure includes the substrate 100, the conductive layer 200, the first pattern definition layer 300, and the pattern transfer layer 400 formed with the second hole h2. After the three groups of trenches G1, G2 and G3 are formed on the first anti-reflection layer 520, the first hole h1 formed at an intersection location of the three groups of trenches G1, G2 and G3 on the first anti-reflection layer 520 is transferred to the second sacrificial layer 420 of the pattern transfer layer 400, such that the hexagonal second hole h2 is formed on the second sacrificial layer 420.

As shown in FIG. 16, a schematic structural diagram of the semiconductor structure in the step of forming a sixth passivation layer 430 on a surface of the pattern transfer layer 400 is typically illustrated. In some embodiments, in this step, the semiconductor structure includes the substrate 100, the conductive layer 200, the first pattern definition layer 300, the pattern transfer layer 400 formed with the second hole h2, and the sixth passivation layer 430. The sixth passivation layer 430 is filled in the second hole h2. The sixth passivation layer 430 may be formed on the surface of the second sacrificial layer 420 of the pattern transfer layer 400 where the second hole h2 is formed, and the sixth passivation layer 430 on the top of the second sacrificial layer 420 may be removed by means of, for example, a chemical mechanical polishing process. In this way, a portion of the sixth passivation layer 430 filled in the second hole h2 may be remained.

Figure 18:
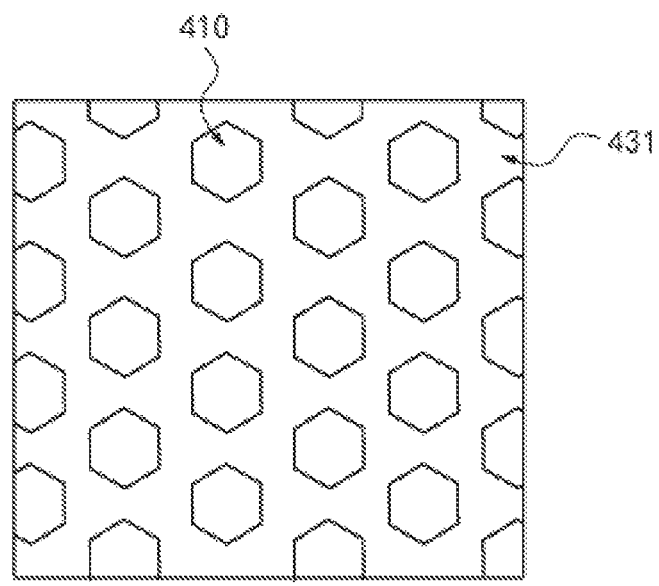

FIG. 17 typically illustrates a schematic structural diagram of the semiconductor structure in the step of forming the first columnar structure 431, and FIG. 18 typically illustrates a plan view of the semiconductor structure in this step. In some embodiments, in this step, the semiconductor structure includes the substrate 100, the conductive layer 200, the first pattern definition layer 300, the remaining pattern transfer layer 400 (that is, the polysilicon contact layer 410), and the first columnar structure 431. After the second sacrificial layer 420 is completely removed, the sixth passivation layer 430 filled in the second hole h2 is remained to form the first columnar structure 431, thereby implementing reverse rotation etching of the first hole h1 of the second pattern definition layer 500. That is, a structure that is finally retained during the downward transfer of the pattern is a portion that is not sheltered by a mask (the second pattern definition layer 500).

Figure 19:
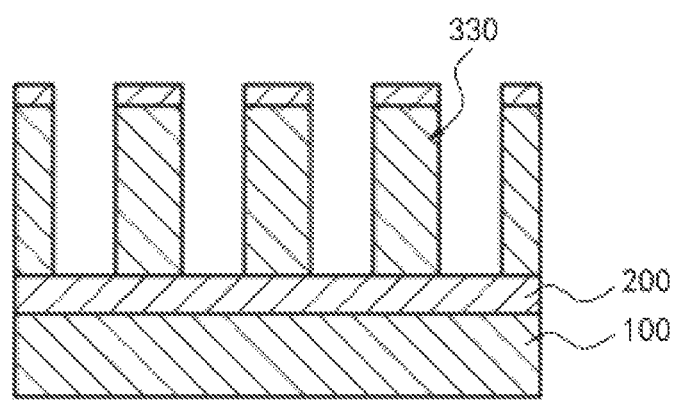

As shown in FIG. 19, a schematic structural diagram of the semiconductor structure in the step of forming a second columnar structure 330 is typically illustrated. In some embodiments, in this step, the semiconductor structure includes the substrate 100, the conductive layer 200, and the second columnar structure 330. The first pattern definition layer 300 is etched away by using the first columnar structure 431 formed by the remaining pattern transfer layer 400 (i.e., the remaining second sacrificial layer 420) as a mask. The top of the second columnar structure 330 has the same shape as the first columnar structure 431, i.e., shaped like a hexagon. Under the action of the etching load effect, the second columnar structure 330 is transformed from a hexagonal straight edge profile at the top to a more regular circular bottom. In addition, in the above step, the remaining pattern transfer layer 400 is completely removed.

Figure 20:
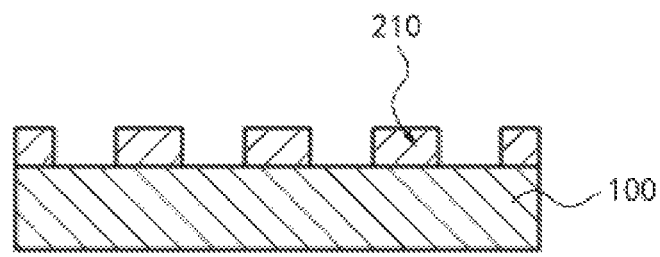
Figure 21:
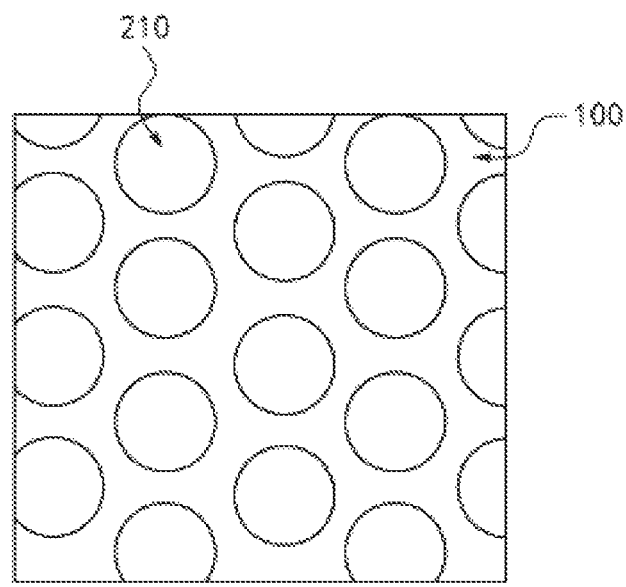

FIG. 20 typically illustrates a schematic structural diagram of the semiconductor structure in the step of forming a connecting pad 210, and FIG. 21 typically illustrates a plan view of the semiconductor structure in this step. In some embodiments, in this step, the semiconductor structure includes the substrate 100 and the remaining conductive layer 200. The portion of the conductive layer 200 not sheltered by the second columnar structure 330 is further etched downward until the remaining conductive layer 200 forms the connecting pad 210, and the shape of the connecting pad 210 is consistent with that of the bottom of the second columnar structure 330, i.e., shaped like a circle. In addition, in the above step, the remaining first pattern definition layer 300 is completely removed.

Figure 22:
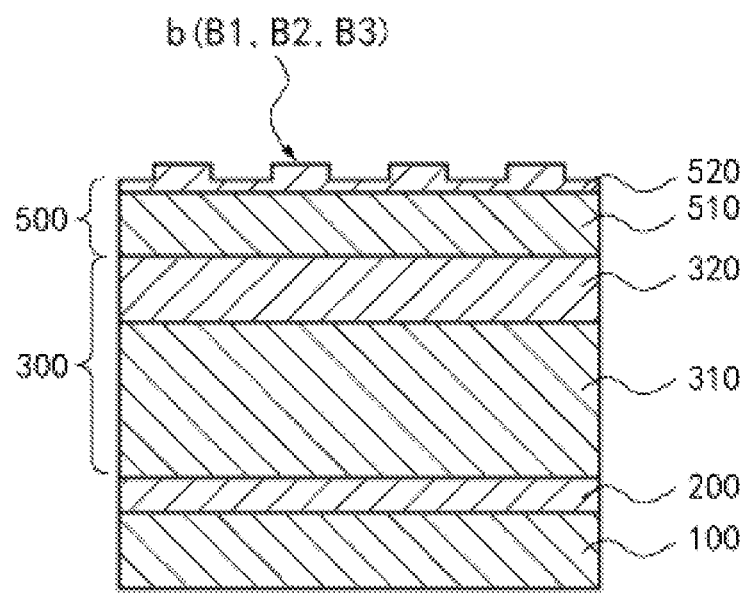
FIGS. 22 to 23 are schematic structural diagrams of the semiconductor structure in some steps of the method for forming a connecting pad according to another embodiment of the present disclosure.

Based on the above detailed description the first embodiment of the method for forming a connecting pad proposed in the present disclosure, a second embodiment of this method will be described below with reference to FIGS. 22 to 24. Among them, FIG. 22 and FIG. 23 respectively show schematic structural diagrams of the semiconductor structure in some steps of this method according to the second embodiment; and FIG. 24 shows a plan view of the semiconductor structure in the step as shown in FIG. 22. A process design in the second embodiment different from that in the first embodiment of the method for forming a connecting pad proposed in the present disclosure will be described below with reference to the accompanying drawings.

Figure 23:
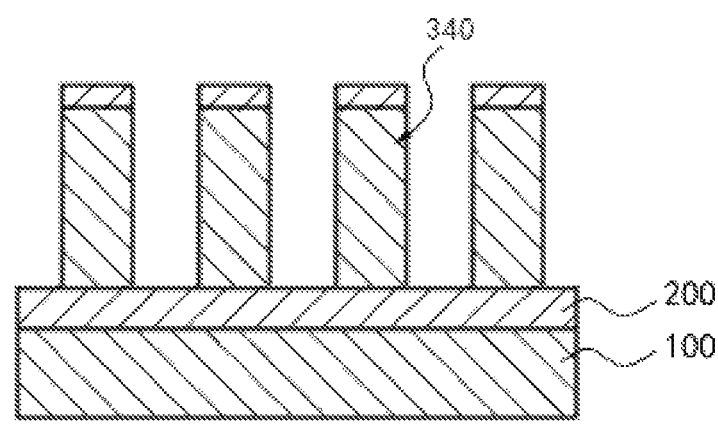
Figure 24:
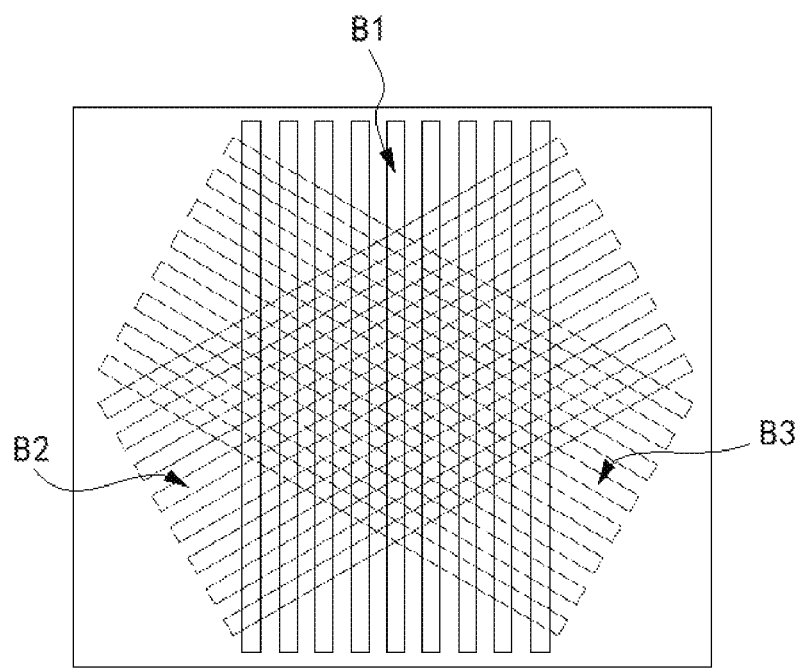
FIG. 24 is a plan view of the semiconductor structure in the step as shown in FIG. 22.

As shown in FIGS. 22 to 24, in this embodiment, the method for forming a connecting pad proposed in the present disclosure includes:

providing a substrate 100;

sequentially forming a conductive layer 200, a first pattern definition layer 300 and a second pattern definition layer 500 on a surface of the substrate 100;

sequentially forming three groups of protruding ribs B1, B2 and B3 intersecting with each other at 120° on the second pattern definition layer 500, wherein an intersection location of the three groups of protruding ribs B1, B2 and B3 forms a hexagonal bulge b on the second pattern definition layer 500;

transferring the bulge b downward, and etching away a portion of the first pattern definition layer 300 corresponding to the bulge b, such that the remaining first pattern definition layer 300 forms a third columnar structure 340 corresponding to the bulge b, wherein a bottom of the third columnar structure 340 is circular in shape under the action of the etching load effect; and etching the conductive layer 200 by using the remaining first pattern definition layer 300 as a mask, such that the remaining conductive layer 200 forms a circular connecting pad 210.

By means of the above design, in this embodiment, the bulge b formed on the second pattern definition layer 500 is used, instead of the first hole in the first embodiment, as a pattern definition structure allowing the first pattern definition layer 300 to define and form the columnar structure in the subsequent steps. In addition, in this embodiment, the bulge b (i.e., the intersection portion of the three groups of protruding ribs B1, B2, and B3) corresponds to the remaining third columnar structure 340 of the first pattern definition layer 300. That is, the bulge b corresponds to a location of the connecting pad finally formed. Accordingly, different from the first embodiment in which a reverse selection mode needs to be employed when the first hole is transferred downward, in this embodiment, a direct etching mode (i.e., a forward selection mode) is employed when the bulge b is transferred downward. On this basis, in this embodiment, it is unnecessary to provide a structure (such as the pattern transfer layer in the first embodiment) required for the implementation of the reverse selection mode and related steps.

That is, based on the above detailed description of the first embodiment and the second embodiment, in various possible embodiments that conform to the design concept of the present disclosure, the method for forming a connecting pad proposed in the present disclosure includes:

providing a substrate;

sequentially forming a conductive layer, a first pattern definition layer and a second pattern definition layer on a surface of the substrate;

sequentially forming a first group of patterns, a second group of patterns, and a third group of patterns intersecting with each other at 120° on the second pattern definition layer, wherein an intersection portion of the three groups of patterns forms a hexagonal pattern definition structure on the second pattern definition layer;

transferring the pattern definition structure downward, and etching away a portion of the first pattern definition layer, such that the remaining first pattern definition layer forms a columnar structure, wherein a bottom of the columnar structure is circular in shape under the action of an etching load effect; and etching the conductive layer by using the remaining first pattern definition layer as a mask, such that the remaining conductive layer forms a circular connecting pad.

Based on the above detailed description of several exemplary embodiments of the method for forming a connecting pad proposed in the present disclosure, an exemplary embodiment of a semiconductor structure proposed in the present disclosure will be described below.

In this embodiment, the semiconductor structure proposed in the present disclosure has a capacitor hole, and the capacitor hole of the semiconductor structure is formed by means of the method for forming a connecting pad proposed in the present disclosure and described in detail in the above embodiments.

In summary, according to the method for forming a connecting pad proposed in the present disclosure, a hexagonal pattern is formed by means of a triple exposure process. In the process of transferring this pattern downward, under the action of the etching load effect, the columnar structure defining the connection pad is transformed from a hexagonal straight edge profile at the top to a more regular circle, such that the shape of the connection pad is significantly improved. By means of the above design, the present disclosure can ensure that the connecting pad is circular, such that the connecting pad has a larger margin during a capacitor patterning process, and it can be stopped on the connecting pad during etching, thus avoiding a problem of capacitor leakage caused by breakdown.

Although description of the present disclosure is made in reference to a plurality of typical embodiments, it shall be understood that terms used herein are exemplary and explanatory only and are not restrictive. The present disclosure can be implemented in various forms without departing from spirit or substance of the present disclosure. Therefore, it shall be understood that the above embodiments are not limited to any foregoing detail, but shall be extensively interpreted within the spirit and scope as defined in the appended claims. Thus, All variations and modifications falling within the claims or equivalent scope thereof shall be covered with the appended claims.

What is claimed is:

1. A method for forming a connecting pad, comprising:
providing a substrate;
sequentially forming a conductive layer, a first pattern definition layer and a second pattern definition layer on a surface of the substrate;
sequentially forming a first group of patterns, a second group of patterns, and a third group of patterns intersecting with each other at 120° on the second pattern definition layer, an intersection portion of the three groups of patterns forming a hexagonal pattern definition structure on the second pattern definition layer;
transferring the pattern definition structure downward, and etching away a portion of the first pattern definition layer, such that the remaining first pattern definition layer forms a columnar structure, wherein a bottom of the columnar structure is circular in shape under an action of an etching load effect; and
etching the conductive layer by using the remaining first pattern definition layer as a mask, such that the remaining conductive layer forms a circular connecting pad.

2. The method for forming the connecting pad according to claim 1, wherein the three groups of patterns respectively are three groups of protruding ribs, such that the pattern definition structure is a protrusion; and wherein the transferring the pattern definition structure downward comprises: transferring the protrusion downward, such that a portion of the first pattern definition layer not corresponding to the protrusion is etched away, and the remaining first pattern definition layer forms the columnar structure corresponding to the protrusion.

3. The method for forming the connecting pad according to claim 1, wherein the first group of patterns, the second group of patterns, and the third group of patterns respectively correspond to a first group of trenches, a second group of trenches, and a third group of trenches, such that the pattern definition structure serves as a first hole; wherein the transferring the pattern definition structure downward comprises: transferring the first hole downward based on a reverse selection mode, such that a portion of the first pattern definition layer not corresponding to the first hole is etched away, and the remaining first pattern definition layer forms the columnar structure corresponding to the first hole.

4. The method for forming the connecting pad according to claim 3, wherein the forming the second pattern definition layer on the surface of the substrate comprises:
forming a second passivation layer on the surface of the substrate;
forming a first anti-reflection layer on a surface of the second passivation layer, the first anti-reflection layer and the second passivation layer together forming the second pattern definition layer, and the three groups of trenches being formed on the first anti-reflection layer.

5. The method for forming the connecting pad according to claim 4, wherein after the three groups of trenches are formed on the first anti-reflection layer, the first hole at an intersection location of the three groups of trenches is transferred to the second passivation layer to form a hole pattern of the second pattern definition layer.

6. The method for forming the connecting pad according to claim 3, wherein the forming the first group of trenches on the second pattern definition layer comprises:
forming a first mask layer on a surface of the second pattern definition layer;
forming a first trench structure on a surface of the first mask layer by means of a pitch multiplication process; and
etching the second pattern definition layer by using the first mask layer as a mask, and transferring the first trench structure to the second pattern definition layer to form the first group of trenches.

7. The method for forming the connecting pad according to claim 6, wherein the forming the first trench structure on the surface of the first mask layer by means of the pitch multiplication process comprises:
forming a first photoresist layer on the surface of the first mask layer;
patterning the first photoresist layer to form a first opening;
forming a third sacrificial layer on the surface of the first mask layer and a surface of the first photoresist layer, the third sacrificial layer covering a sidewall and a bottom wall of the first opening; and
etching away the third sacrificial layer positioned on the surface of the first mask layer and a top of the first photoresist layer, the remaining third sacrificial layer serving as the first trench structure.

8. The method for forming the connecting pad according to claim 6, wherein the forming the first mask layer on the surface of the second pattern definition layer comprises:
forming a third passivation layer on the surface of the second pattern definition layer; and forming a second anti-reflection layer on a surface of the third passivation layer, the second anti-reflection layer and the third passivation layer together forming the first mask layer.

9. The method for forming the connecting pad according to claim 3, wherein the forming the second group of trenches on the second pattern definition layer comprises:
forming a second mask layer on a surface of the second pattern definition layer, the second mask layer filling in the first group of trenches;
forming a second trench structure on a surface of the second mask layer by means of a pitch multiplication process; and
etching the second pattern definition layer by using the second mask layer as a mask, and transferring the second trench structure to the second pattern definition layer to form the second group of trenches.

10. The method for forming the connecting pad according to claim 9, wherein the forming the second trench structure on the surface of the second mask layer by means of the pitch multiplication process comprises:
forming a second photoresist layer on the surface of the second mask layer;
patterning the second photoresist layer to form a second opening;
forming a fourth sacrificial layer on the surface of the second mask layer and a surface of the second photoresist layer, the fourth sacrificial layer covering a sidewall and a bottom wall of the second opening; and
etching away the fourth sacrificial layer positioned on the surface of the second mask layer and a top of the second photoresist layer, the remaining fourth sacrificial layer serving as the second trench structure.

11. The method for forming the connecting pad according to claim 9, wherein the forming the second mask layer on the surface of the second pattern definition layer comprises:
forming a fourth passivation layer on the surface of the second pattern definition layer, the fourth passivation layer filling in the first group of trenches; and
forming a third anti-reflection layer on a surface of the fourth passivation layer, the third anti-reflection layer and the fourth passivation layer together forming the second mask layer.

12. The method for forming the connecting pad according to claim 3, wherein the forming the third group of trenches on the second pattern definition layer comprises:
forming a third mask layer on a surface of the second pattern definition layer, the third mask layer filling in the first group of trenches and the second group of trenches;
forming a third trench structure on a surface of the third mask layer by means of a pitch multiplication process; and
etching the second pattern definition layer by using the third mask layer as a mask, and transferring the third trench structure to the second pattern definition layer to form the third group of trenches.

13. The method for forming the connecting pad according to claim 12, wherein the forming the third trench structure on the surface of the third mask layer by means of the pitch multiplication process comprises:
forming a third photoresist layer on the surface of the third mask layer;
patterning the third photoresist layer to form a third opening;
forming a fifth sacrificial layer on the surface of the third mask layer and a surface of the third photoresist layer, the fifth sacrificial layer covering a sidewall and a bottom wall of the third opening; and
etching away the fifth sacrificial layer positioned on the surface of the third mask layer and a top of the third photoresist layer, the remaining fifth sacrificial layer serving as the third trench structure.

14. The method for forming the connecting pad according to claim 12, wherein the forming the third mask layer on the surface of the second pattern definition layer comprises:
forming a fifth passivation layer on the surface of the second pattern definition layer, the fifth passivation layer filling in the first group of trenches and the second group of trenches; and
forming a fourth anti-reflection layer on a surface of the fifth passivation layer, the fourth anti-reflection layer and the fifth passivation layer together forming the third mask layer.

15. The method for forming the connecting pad according to claim 3, wherein a pattern transfer layer is formed between the first pattern definition layer and the second pattern definition layer, the etching away the portion of the first pattern definition layer based on the reverse selection mode comprising:
etching the pattern transfer layer by using the second pattern definition layer as a mask, transferring the first hole to the pattern transfer layer to form a second hexagonal hole;
forming a sixth passivation layer on a surface of the pattern transfer layer, the sixth passivation layer filling in the second hole and being flush with the surface of the pattern transfer layer;
removing the remaining pattern transfer layer, such that the sixth passivation layer forms a hexagonal columnar structure positioned on a surface of the first pattern definition layer; and
etching the first pattern definition layer by using the sixth passivation layer as a mask, the remaining first pattern definition layer forming the columnar structure.

16. The method for forming the connecting pad according to claim 15, wherein the pattern transfer layer comprises a polysilicon contact layer and a second sacrificial layer, the polysilicon contact layer being formed on the surface of the first pattern definition layer, and the second sacrificial layer being formed between the polysilicon contact layer and the second pattern definition layer; and wherein the transferring the first hole to the pattern transfer layer comprises: transferring the first hole to the second sacrificial layer, the second hole being formed on the second sacrificial layer.

* * * * *